(12) United States Patent
Lim

(10) Patent No.: US 8,563,357 B2
(45) Date of Patent: Oct. 22, 2013

(54) METHOD OF PACKAGING A DIE

(75) Inventor: Chee Chian Lim, Alor Gajah Melaka (MY)

(73) Assignee: Infineon Technologies AG, Neubiberg (DE)

(*) Notice: Subject to any disclaimer, the term of this patent is extended or adjusted under 35 U.S.C. 154(b) by 511 days.

(21) Appl. No.: 12/147,051

(22) Filed: Jun. 26, 2008

(65) Prior Publication Data

US 2009/0321961 A1   Dec. 31, 2009

(51) Int. Cl.
    *H01L 29/40* (2006.01)
(52) U.S. Cl.
    USPC ........... 438/106; 438/110; 438/113; 438/118; 438/612; 438/613; 438/615; 257/E21.508
(58) Field of Classification Search
    USPC ............................ 438/106, 118; 257/E21.508
    See application file for complete search history.

(56) References Cited

U.S. PATENT DOCUMENTS

| 5,442,852 A | 8/1995 | Danner | |
| 6,268,275 B1 * | 7/2001 | Cobbley et al. | 438/612 |
| 6,297,560 B1 * | 10/2001 | Capote et al. | 257/778 |
| 6,426,564 B1 | 7/2002 | Ball | |
| 7,109,058 B2 * | 9/2006 | Yamada et al. | 438/106 |
| 2003/0080397 A1 * | 5/2003 | Sakuyama et al. | 257/667 |

* cited by examiner

*Primary Examiner* — Kenneth Parker
*Assistant Examiner* — Jose R Diaz
(74) *Attorney, Agent, or Firm* — Slater & Matsil, L.L.P.

(57) ABSTRACT

A method of attaching a die to a substrate is disclosed. A major surface of the die has an array of electrical contacts, and is covered with a tape segment having an array of apertures in register with the contacts. Solder balls are inserted into the apertures. The die is positioned against a substrate with the solder balls in register with the die pads on the surface of the substrate, and a heat treatment process is performed to bond the conductive elements to the corresponding bond pads.

23 Claims, 3 Drawing Sheets

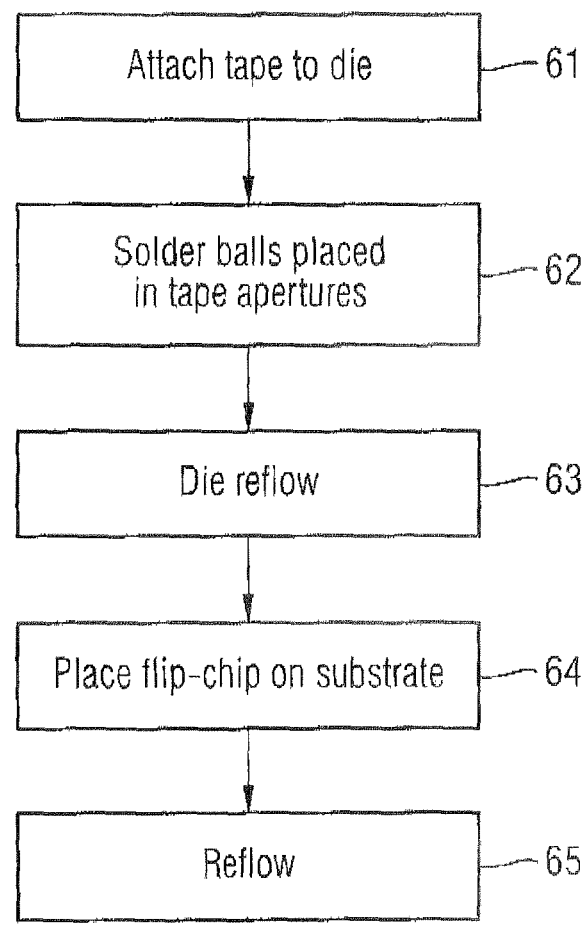

METHOD OF PACKAGING A DIE

BACKGROUND

One known type of die (that is a body, largely composed of semiconductor material, containing electronic circuitry formed therein and which is a fragment of a semiconductor wafer) has an array of electrical contacts on at least one of its major sides. The die is attached to a substrate (typically a circuit board) in the following steps. Firstly, an array of electrically conductive bumps (solder balls) are formed on the respective electrical contacts of the die, to form a flip chip. (Optionally, the solder balls are placed on the wafer before the wafer is singulated into individual dies, thereby forming the flip chips.)

The flip chip is then inverted and positioned with the solder balls on respective bond pads of the substrate, with a small space between the die and the substrate. The solder is then heated to cause re-flow, in which an electrical connection is produced between the balls and the respective bond pads of the substrate. An electrically-insulating adhesive ("underfill") is then injected into the space and then cured. The underfill provides a strong mechanical connection between the die and substrate, and a heat bridge between them, and ensures the solder joints are not stressed in use due to differential heating of the chip and the rest of the system.

This process is relatively slow because it takes considerable time to fill the space between the die and the substrate. For example, this may take 4 to 5 minutes for a 6 mm die with a 3 mm gap. Since this step is performed individually for each substrate (e.g., each circuit board), it can cause a bottleneck in a process which produces a great many dies from each wafer. Furthermore, the separate curing procedure may take 1-4 hours. Furthermore, air bubbles may be trapped between the die and the substrate, creating "voids". Also, a lateral force is applied to the solder balls during the insertion of the underfill layer which may displace them. This is expected to become an increasing problem in the future as the pitch of the die pads of the flip chip becomes increasingly fine.

The underfill material is typically a thermosetting material, so once the die and substrate are attached, they are hard to separate again. Choosing the underfill material is subject to conflicting requirements. If the material has high filler loading, it tends to flow slowly into the space between the die and the substrate. Conversely, if it has low filler loading, it becomes subject to "popcorning". Furthermore, some suitable underfill materials have a relatively short floor life before their curing properties degrade. Also, if subsequent process steps expose the underfill layer to solvents, the solvents may cause voiding or bubbling within the cured underfill.

An alternative attachment procedure is to dispense the liquid underfill onto the bond pads before positioning the flip-chip onto it. That is, the flip-chip is moved towards the substrate, such that the solder balls push the adhesive out of their way, until the solder balls make contact with the respective bond pads of the substrate. Once the solder balls have contacted the respective bond pads of the substrate, a heat treatment process is performed to bond the solder balls to the bond pads and to cure the underfill.

Note that once the bond pads of the substrate are covered by the underfill, aligning the flip chip with them is less than straightforward. Although the alignment may be performed before the underfill material is dispensed, this alignment may degrade when the flip chip is moved towards the substrate, and there is a tendency for the die to "float" on the underfill material (that is for the resistance of the underfill to displace the flip chip from its correct position). Furthermore, underfill material may remain trapped between the solder balls and the bond pads, risking mechanical or electrical joint failure.

Furthermore, this alternative procedure shares many of the disadvantages of the first technique explained above. It is performed at a package level, so it is relatively slow. Also, it too is susceptible to voiding. Also, materials which would allow it to be performed reliably are not yet available. For example, the material should have a coefficient of thermal expansion (CTE) no higher than 80 ppm/K, to ensure that it is not damaged during the heat treatment process, and such materials are not readily available. Also, there is potential for moisture to be absorbed into the underfill, damaging it. Also, once the curing operation is concluded, the resulting package is not reworkable.

SUMMARY OF THE INVENTION

Embodiments of the present invention propose that a surface of a die is covered by a tape segment comprising a plurality of apertures corresponding to electrical contacts of the die. Conductive elements are inserted into the apertures, and bonded to the contacts. The die is located on a substrate with the conductive elements in register with die pads of the substrate, and the conductive elements are bonded to the die pads by a heat treatment.

BRIEF DESCRIPTION OF THE DRAWINGS

An embodiment of the invention will now be described, for the sake of example only, with reference to the following figures in which:

FIG. 2 is a flow diagram of the steps of the embodiment.

DETAILED DESCRIPTION OF ILLUSTRATIVE EMBODIMENTS

Figure 1A:
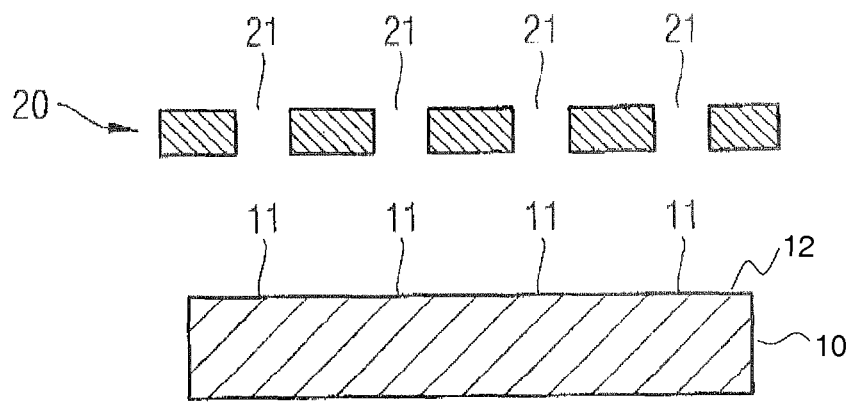
FIG. 1, which is composed of FIGS. 1(a) to 1(e), shows the steps of the an embodiment of the invention.

Referring firstly to FIG. 1, a method which is an embodiment of the invention is shown. The steps of the method are shown in FIG. 2. In FIG. 1(a), a die 10 (shown in side view) has a regular array of electrical contacts 11 on its major surface 12.

The major surface 12 of the die 10 is covered with a segment of tape 20 (shown in a cross-sectional side view) having a regular array of apertures (through-holes) 21 within it (step 61). Although in FIG. 1, for simplicity, only a single die 10 and tape segment 20 are shown separate, in fact, the tape segment 20 may be applied to the die 10 before the singulation process which separates multiple dies from a single wafer. For example, a tape can be applied to the wafer such that the tape extends over a plurality of portions of the wafer which are to be singulated into respective dies. Then the tape may be segmented (i.e., divided into tape segments 20) during the singulation of the wafer, so that there is one tape segment 20 attached to each respective die 10.

The tape is typically an elastomeric material which may comprise one or more of rubber, silica and resin. It has a thickness which is at least about 15 μm, and may be significantly more. It carries a first layer of adhesive on the side facing the die, for adhering each tape segment 20 to the respective die 10. As described in more detail below, it also comprises a second layer of adhesive on the side facing away from the die 10.

Figure 1B:
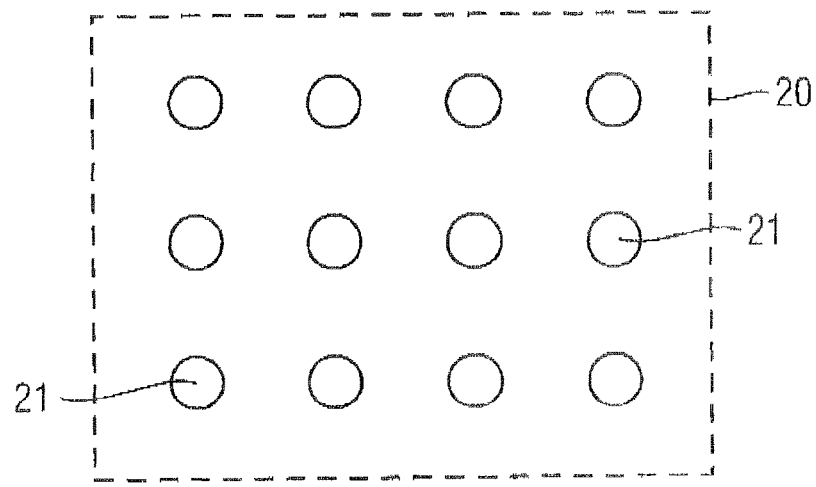

A view of the tape segment 20 facing one of its major surfaces is given in FIG. 1(b).

Figure 1C:
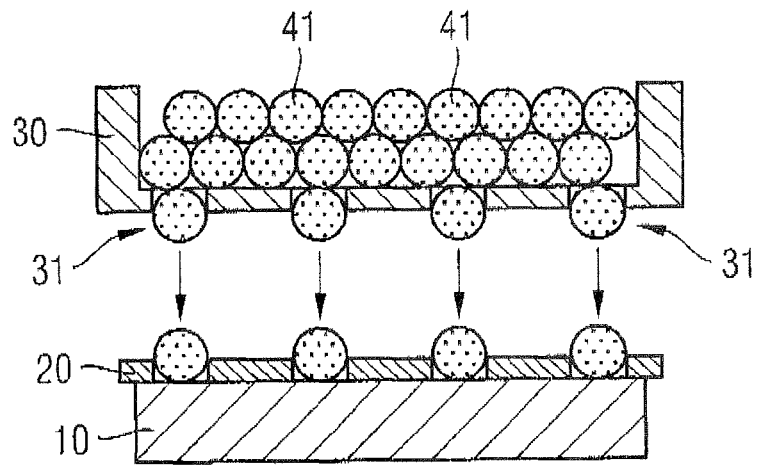

Subsequently, in FIG. 1(c), the tape segment 20 and die 10 are placed beneath a reservoir 30 which holds many solder balls 41. The reservoir 30 contains apertures 31 through which the solder balls 41 fall onto the surface of the tape 20 (step 62). The apertures 31 are aligned with the apertures 21. The balls 41 are slightly smaller than the holes 21, and come to rest inside respective holes 21.

A first heat treatment process ("die reflow") is then performed, in which the solder balls 41 become bonded to the major surface 12 of the die 10 (step 63).

Figure 1D:
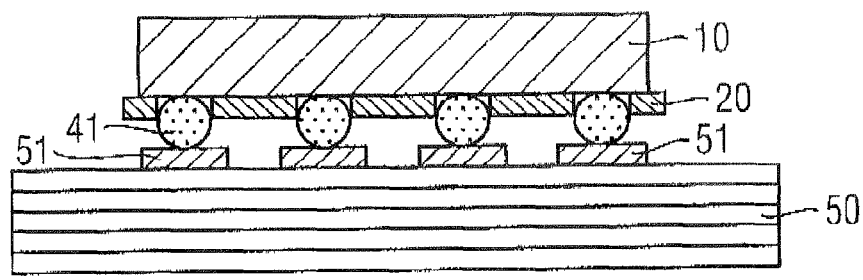

The die is then inverted, and placed onto a substrate 50 (which may be a printed circuit board, PCB), having an array of bond pads 51, as shown in FIG. 1(d) (step 64).

Figure 1E:
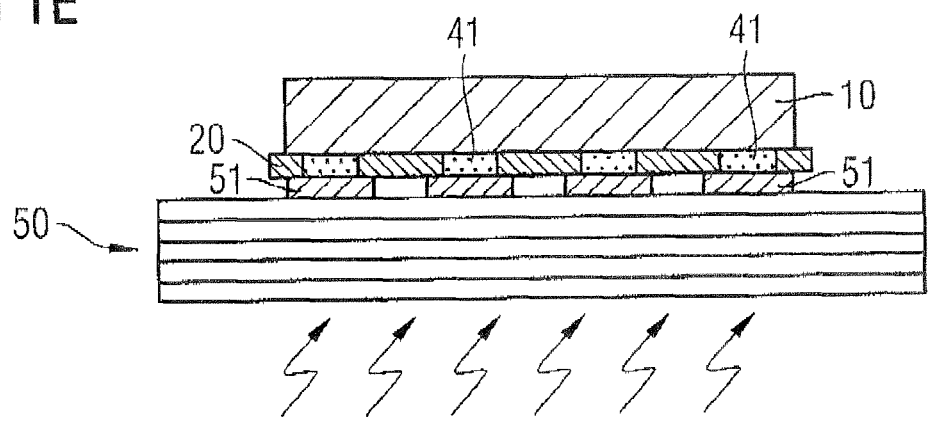

A second heat treatment process ("reflow") is then performed in which the solder balls 41 are melted into discs filling the apertures 21, and in particular bonding the solder balls 41 to the bond pads 51 (step 65). The melting solder balls 41 are held in place by the tape segment 20, to give a high reliability solder joint. The second layer of adhesive (which may be the same kind of adhesive as used in the first layer, or a different kind of adhesive) on the surface of the tape segment 20 facing away from the die 10, adheres the tape segment 20 to a portion of the substrate 50 (e.g., to its bond pads 51 as shown in FIG. 1(e)).

The tape segment 20, which is not removed in use, makes it unnecessary to provide an underfill layer between the die 10 and the substrate 50. The tape segment 20 provides a heat bridge between the die 10 and the substrate 50, and stress relief when the structure of FIG. 1(e) is in use. The tape segment 20 will hold each solder ball firmly in directions parallel to the major face of the die 10. Due to the elasticity of the tape segment 20 it acts like many micro-springs, to enhance the reliability performance. The tape segment 20 re-enforces the solder balls' connection between the die pads and the PCB board pads, which reduces common solder ball cracking issues due to CTE (coefficient of thermal expansion) mismatch.

Since no underfill layer is required, the various problems associated with an underfill layer (e.g., under-cure and voiding) are eliminated. Furthermore, since there is no process of applying underfill, no lateral stress is applied to the solder balls. This is particularly important for fine pitch flip chips.

The thickness of the spacing between the die 10 and the substrate 50 is guaranteed by the thickness of the tape segment 20. That is, there is consistent "standoff". Typically, the spacing of the contacts 11 and the bond pads 51 is substantially equal to the thickness of the tape segment 20. This is true even though the solder balls 41 substantially collapse due to the reflow process. The tape segment's thickness also acts as a Z-direction stress absorber for die stress relief after the solder reflow and in use.

Although only a single embodiment of the invention has been described in detail, many variations are possible within the scope of the invention as defined by the appended claims.

For example, as mentioned above the tape segments may be produced by applying a single tape to a wafer so that it extends over multiple portions which are to be singulated into dies, and then singulating the tape at the same time as the singulation of the wafer, to form respective tape segments attached to each die. However, in an alternative, the tape segments may be discrete and adhered individually to dies which have already been singulated.

Furthermore, although in the embodiments described, the tape segments are adhered to the die (or wafer) by adhesive, in some embodiments the tape may be attached by a heating process which partially melts the surface of the tape onto the die and/or wafer surface.

Similarly, in some embodiments the tape segments may be attached to the substrate at least partly by a heating process.

Although the die is shown above as having an array of only twelve electrical contacts, the number of contacts may be higher or lower.

Instead of the electrical contacts having a rectangular array, they may have any other such array, such as a hexagonal array. The die may also be a flip-chip of the kind which additionally has electrical contacts on a face facing away from the substrate, and which are intended to be wire-bonded (e.g., to further die pads on the substrate). The die may have any electronic functionality (e.g., it may be a memory, a microcontroller, etc).

What is claimed is:

1. A method of attaching a die to a substrate, the method comprising:
    placing a pre-manufactured tape segment on a surface of the die, the die comprising a plurality of electrical contacts and the pre-manufactured tape segment comprising a plurality of apertures before it is placed on the surface of the die, each electrical contact corresponding to a respective one of the plurality of apertures;
    placing a plurality of solder balls into the plurality of apertures;
    bonding the plurality of solder balls to the plurality of electrical contacts;
    locating the die on the substrate, with the plurality of solder balls in register with a plurality of respective bond pads of the substrate; and
    bonding the plurality of solder balls to the plurality of bond pads, the pre-manufactured tape segment being elastic after bonding the plurality of solder balls to the plurality of bond pads.

2. The method according to claim 1, wherein-the plurality of solder balls fill the plurality of apertures in the pre-manufactured tape segment, while performing a heat treatment.

3. The method according to claim 1, further comprising singulating the die from a wafer, wherein the pre-manufactured tape segment is attached to the die prior to the singulating.

4. The method according to claim 1, wherein the pre-manufactured tape segment has a thickness of at least 15 μm.

5. The method according to claim 1, wherein the pre-manufactured tape segment is adhered to the die.

6. The method according to claim 1, wherein bonding the plurality of solder balls to the plurality of bond pads comprises performing a heat treatment to the plurality of solder balls.

7. The method according to claim 1, wherein placing the die to the substrate comprises melting a surface of the pre-manufactured tape segment.

8. The method according to claim 1, wherein locating the die on the substrate comprises adhering the pre-manufactured tape segment to the substrate.

9. The method according to claim 8, wherein adhering the pre-manufactured tape segment to the substrate comprises partially melting a surface of the pre-manufactured tape segment.

10. A method comprising:
    receiving a pre-manufactured tape segment, wherein the pre-manufactured tape segment comprises a plurality of apertures;
    placing the pre-manufactured tape segment on a surface of a die, wherein the die comprises a plurality of electrical contacts, and wherein each electrical contact corresponds to a respective one of the plurality of apertures;

placing a plurality of connection units into the plurality of apertures;

bonding the plurality of connection units to the plurality of electrical contacts;

adhering the die on a substrate, with the plurality of connection units in register with a plurality of respective bond pads of the substrate; and performing a heat treatment to bond the plurality of connection units to the plurality of bond pads.

11. The method according to claim 10, wherein placing the pre-manufactured tape segment on the surface of the die comprises adhering the pre-manufactured tape segment to the surface of the die.

12. The method according to claim 11, wherein adhering the pre-manufactured tape segment to the surface of the die comprises partially melting a surface of the pre-manufactured tape segment.

13. The method according to claim 10, wherein adhering the pre-manufactured tape segment to the substrate comprises partially melting a surface of the pre-manufactured tape segment.

14. The method according to claim 10, wherein placing the plurality of connection units into the plurality of apertures comprises placing solder balls received from a reservoir into the plurality of apertures.

15. The method according to claim 10, wherein a height of the pre-manufactured tape segment defines a distance between the die and the substrate.

16. The method according to claim 10, wherein the pre-manufactured tape segment comprises an elastomeric material.

17. A method of attaching a die to a substrate, the method comprising:

covering a surface of the die with a pre-manufactured tape segment, the die comprising a plurality of electrical contacts and the pre-manufactured tape segment comprising a plurality of apertures, each electrical contact corresponding to one of the plurality of apertures;

placing a plurality of solder balls into the plurality of apertures;

bonding the plurality of solder balls to the plurality of electrical contacts;

locating the die on the substrate, with the plurality of solder balls in register with a plurality of respective bond pads of the substrate; and performing a heat treatment to bond the plurality of solder balls to the plurality of bond pads, wherein a layer of adhesive of the tape segment is directly bonded to the bond pads but not to the substrate.

18. The method according to claim 17, wherein the plurality of solder balls fill the plurality of apertures in the pre-manufactured tape segment while performing the heat treatment.

19. The method according to claim 17, further comprising singulating the die from a wafer, wherein the pre-manufactured tape segment is attached to the die prior to the singulating.

20. The method according to claim 17, wherein the pre-manufactured tape segment comprises an elastomeric material.

21. The method according to claim 17, wherein the pre-manufactured tape segment has a thickness of at least 15 μm.

22. The method according to claim 17, wherein the pre-manufactured tape segment is adhered to the die.

23. A method of attaching a die to a substrate, the method comprising:

placing a pre-manufactured tape segment on a surface of the die, the die comprising a plurality of electrical contacts and the pre-manufactured tape segment comprising a plurality of apertures before it is placed on the surface of the die, each electrical contact corresponding to a respective one of the plurality of apertures;

placing a plurality of solder balls into the plurality of apertures;

bonding the plurality of solder balls to the plurality of electrical contacts;

locating the die on the substrate, with the plurality of solder balls in register with a plurality of respective bond pads of the substrate, wherein a height of the pre-manufactured tape segment is the height between the die and the substrate; and bonding the plurality of solder balls to the plurality of bond pads.

* * * * *